US012751312B2

United States Patent

(12) United States Patent
Nad et al.

(10) Patent No.: US 12,751,312 B2
(45) Date of Patent: Sep. 29, 2026

(54) NANO-ROUGHENED INTERCONNECTS FOR INTEGRATED CIRCUIT PACKAGES

(71) Applicant: Intel Corporation, Santa Clara, CA (US)

(72) Inventors: Suddhasattwa Nad, Chandler, AZ (US); Gang Duan, Chandler, AZ (US); Jeremy Ecton, Gilbert, AZ (US); Brandon Marin, Gilbert, AZ (US); Ravindranath Mahajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 658 days.

(21) Appl. No.: 17/448,693

(22) Filed: Sep. 23, 2021

(65) Prior Publication Data

US 2023/0090449 A1 Mar. 23, 2023

(51) Int. Cl.
*H10W 72/20* (2026.01)
*H10W 72/00* (2026.01)
(Continued)

(52) U.S. Cl.
CPC ......... *H10W 72/20* (2026.01); *H10W 72/019* (2026.01); *H10W 72/072* (2026.01); *H10W 72/29* (2026.01); *H10W 72/90* (2026.01); *H10W 80/011* (2026.01); *H10W 72/01253* (2026.01); *H10W 72/234* (2026.01); *H10W 72/252* (2026.01); *H10W 72/923* (2026.01); *H10W 72/934* (2026.01); *H10W 72/952* (2026.01);
(Continued)

(58) Field of Classification Search
CPC ... H01L 2225/1058; H01L 2924/01029; H01L 2224/16238; H01L 24/13; H01L 24/05; H01L 24/16; H01L 24/81; H01L 24/06; H01L 24/08; H01L 24/09; H01L 24/17; H01L 24/14; H10W 72/20; H10W 72/072; H10W 72/90; H10W 72/29; H10W 72/019; H10W 90/00; H10W 80/00; H10W 80/011; H10W 40/255
See application file for complete search history.

(56) References Cited

U.S. PATENT DOCUMENTS 5,545,589 A * 8/1996 Tomura .................. H01L 24/11 438/665
7,863,743 B1 * 1/2011 Shi ...................... H01L 25/0657 257/739
(Continued)

OTHER PUBLICATIONS

Yang et al., "Development of Low-temperature, Pressureless Copper-to-Copper Bonding by Microfluidic Electroless Interconnection Process," 2018 IEEE 68th Electronic Components and Technology Conference, 6 pages.
(Continued)

*Primary Examiner* — Alonzo Chambliss
(74) *Attorney, Agent, or Firm* — Hanley, Flight & Zimmerman, LLC

(57) ABSTRACT

Methods, systems, apparatus, and articles of manufacture to produce nano-roughened integrated circuit packages are disclosed. An example integrated circuit (IC) package includes a substrate, a semiconductor die, and a metal interconnect to electrically couple the semiconductor die to the substrate, the metal interconnect including a nano-roughened surface.

20 Claims, 8 Drawing Sheets

(51) Int. Cl.
*H10W 72/29* (2026.01)
*H10W 72/90* (2026.01)
*H10W 80/00* (2026.01)
*H10W 90/00* (2026.01)

(52) U.S. Cl.
CPC .......... *H10W 80/033* (2026.01); *H10W 90/00* (2026.01); *H10W 90/724* (2026.01); *H10W 90/794* (2026.01)

(56) References Cited

U.S. PATENT DOCUMENTS

| | | | | |
|---|---|---|---|---|
| 8,409,979 | B2 * | 4/2013 | Choi | H01L 24/11 257/E23.021 |
| 8,518,304 | B1 * | 8/2013 | Sammakia | H01B 1/24 252/502 |
| 10,217,807 | B2 * | 2/2019 | Lee | H10K 59/131 |
| 2006/0108685 | A1 * | 5/2006 | Tsou | H01L 24/10 257/737 |
| 2007/0045812 | A1 * | 3/2007 | Heng | H01L 24/13 257/E21.511 |
| 2015/0014842 | A1 | 1/2015 | Honda et al. | |
| 2015/0034366 | A1 * | 2/2015 | Yoshioka | H05K 3/0079 174/251 |
| 2020/0315023 | A1 | 10/2020 | Nad et al. | |

OTHER PUBLICATIONS

Koo et al., "Copper Electroless Bonding of Dome-Shaped Pillars for Chip-to-Package Interconnect," Journal of The Electrochemical Society, 158 (12) D698-D703, Oct. 31, 2011, 6 pages.

Li et al., "Cu—Cu bonding by low-temperature sintering of self-healable Cu nanoparticles," 2019 IEEE 69th Electronic Components and Technology Conference (ECTC), 6 pages.

Li et al., "Low-Temperature and Low-Pressure Cu—Cu Bonding by Highly Sinterable Cu Nanoparticle Paste," Nanoscale Research Letters, 2017, 6 pages.

* cited by examiner

NANO-ROUGHENED INTERCONNECTS FOR INTEGRATED CIRCUIT PACKAGES

FIELD OF THE DISCLOSURE

This disclosure relates generally to integrated circuits and, more particularly, to methods, systems, apparatus, and articles of manufacture to produce integrated circuit packages with nano-roughened interconnects.

BACKGROUND

In many integrated circuit packages, one or more semiconductor dies are mechanically and electrically coupled to an underlying package substrate. Frequently, the coupling of a die to an underlying substrate is achieved by aligning and connecting metal pads and/or bumps fabricated on a surface of the die with corresponding pads and/or bumps on a facing surface of an underlying substrate (e.g., a separate die or a package substrate). The interconnects formed by these mating pads and/or bumps are sometimes referred to as first level interconnects. As integrated circuits and their associated packages continue to decrease in size, the bumps and/or pads associated with first level interconnects also need to decrease in size.

Figure 1:
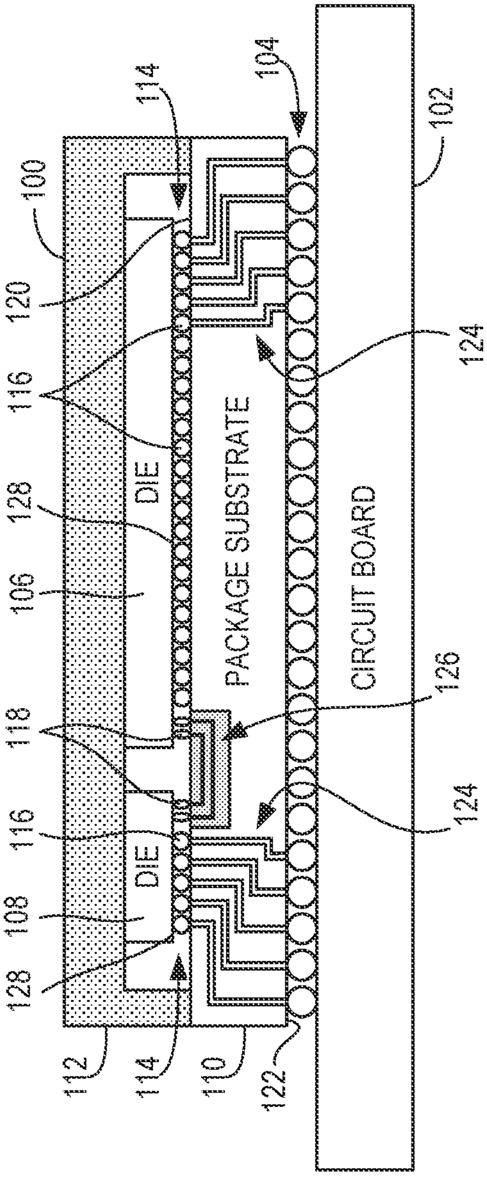
FIG. 1 illustrates an example integrated circuit (IC) package constructed in accordance with teachings of this disclosure.

The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections.

DETAILED DESCRIPTION

In some integrated circuit (IC) packages, a die (e.g., a semiconductor die, a silicon die) is mechanically and/or electrically coupled to a substrate (e.g., a package substrate or a separate semiconductor die) via one or more metal interconnects. In some cases, the metal interconnects include bumps fabricated on a first surface of the substrate, and corresponding pads fabricated on a second surface of the die. In some cases, the die includes bumps with the substrate having corresponding pads. Further, in some cases, both the die and the substrate including corresponding bumps. Typically, coupling of the die and the substrate is achieved by soldering of the corresponding bumps and/or pads to form first level interconnects between the die and the underlying substrate, such that electrical signals can pass between the die and the substrate via the interconnects.

A need for increased connectivity and input/output speeds of IC packages continues to motivate efforts directed to increasing the number of interconnects that can be implemented between a die and a substrate. In some cases, by increasing the number of interconnects, speed and/or bandwidth of information travel through the interconnects can be increased. However, increasing the number of interconnects that can be fabricated in a given surface area depends on reducing the size of the interconnects and/or the bump-to-bump pitch scaling of the interconnects. The size and pitch of bumps is typically limited based on manufacturing constraints. One possible manufacturing constraint is limited precision when applying solder material (e.g., tin) to the bumps to form the interconnects. In some cases, when soldering is used to couple the bumps of the substrate to pads of the die, imprecise and/or excessive application of solder material may result in solder bridging. Solder bridging occurs when two or more interconnects of the IC package are inadvertently electrically coupled via solder material, and may result in a short circuit and/or damage to the two or more interconnects and/or components electrically coupled via the interconnects. As such, interconnects that are formed via soldering require sufficient spacing to reduce the possibility of solder bridging, thereby reducing the number of interconnects that may be manufactured on a given surface.

Examples disclosed herein enable coupling of bumps and pads between a die and a substrate without the use of solder. In examples disclosed herein, bumps fabricated on the substrate are nano-roughened using one or more surface treatments prior to the bumps being bonded to corresponding pads on the due. In such examples, the nano-roughened bumps include nano-roughened surfaces having high-frequency, low-amplitude surface features. In some examples, the surface features of the nano-roughened bumps on a substrate interlock with corresponding surface features on a die pad surface of the die. Heat and/or pressure are applied to the mating substrate and die to cause direct copper-to-copper bonding between the nano-roughened bumps on the substrate and corresponding ones of the pads on the die. Such direct copper-to-copper bonding results in interconnects formed exclusively of copper that continuously extends between the die and the substrate without the use of any solder. In some examples, the heat applied to the substrate and/or the die is at a first temperature (e.g., less than 300 degrees Celsius) that is less than a second temperature required for soldering.

Advantageously, by reducing and/or eliminating the use of solder, examples disclosed herein reduce the occurrence of manufacturing defects such as solder bridging. Examples disclosed herein also enable the fabrication of smaller interconnects and/or a reduction in the spacing of interconnects, thereby increasing the number of interconnects that can be fabricated between surfaces. Scaling down the size and spacing of interconnects in this manner serves to improve connectivity and/or communication speeds between the die and the substrate. Additionally, the low-amplitude, high-frequency characteristics of nano-roughened surfaces in examples disclosed herein enable copper-to-copper bonding with relatively small and relatively few interfacial voids, thus enabling formation of a more reliable interconnect joint. Additionally, by reducing temperatures at which such copper-to-copper bonding can occur, examples disclosed herein are suitable for use with organic substrate materials that may otherwise become damaged at the relatively high temperatures required for soldering.

In examples disclosed herein, a "nano-roughened surface" or a "low-amplitude, high-frequency surface" refers to a surface having a surface morphology with a roughness skewness greater than 0, a roughness kurtosis less than 3, and a root mean square roughness less than or equal to 500 nanometers (nm). In examples disclosed herein, an "interconnect" refers to a an electrical connection between a substrate and a die mounted thereon. Thus, an interconnect includes a bump, a pad, a protrusion, or a raised surface on a substrate bonded to a corresponding bump, pad, protrusion, or raised surface on a semiconductor die.

FIG. 1 illustrates an example integrated circuit (IC) package 100 that is electrically coupled to a circuit board 102 via an array of bumps or balls 104 (e.g., a ball grid array). In some examples, the IC package 100 may include pins and/or pads, in addition to or instead of the balls 104, to enable the electrical coupling of the package 100 to the circuit board 102. In this example, the package 100 includes two semiconductor (e.g., silicon) dies 106, 108 that are mounted to a substrate (e.g., a package substrate) 110 and enclosed by a package lid or mold compound 112. While the example IC package 100 of FIG. 1 includes two dies 106, 108, in other examples, the package 100 may have only one die or more than two dies.

As shown in the illustrated example, each of the dies 106, 108 is electrically and mechanically coupled to the substrate 110 via corresponding arrays of interconnects 114. The electrical connections between the dies 106, 108 and the substrate 110 (e.g., the interconnects 114) are sometimes referred to as first level interconnects. By contrast, the electrical connections between the IC package 100 and the circuit board 104 (e.g., the balls 104) are sometimes referred to as second level interconnects. In some examples, one or both of the dies 106, 108 may be stacked on top of one or more other dies. In such examples, the dies 106, 108 are coupled to the underlying die through a first set of first level interconnects and the underlying die may be connected to the package substrate 110 via a separate set of first level interconnects associated with the underlying die. Thus, as used herein, first level interconnects are formed from the mating and bonding of bumps and/or pads between a die and a package substrate or a die and a separate, underlying die.

As shown in FIG. 1, the interconnects 114 of the first level interconnects include two different types of bumps corresponding to core bumps 116 and bridge bumps 118. As used herein, core bumps 116 refer to bumps on the dies 106, 108 through which electrical signals pass between the dies 106, 108 and components external to the IC package 100. Thus, as shown in the illustrated example, the core bumps 116 physically connected to the inner surface 120 of the substrate 110 are electrically coupled to the balls 104 on the external surface 122 of the substrate 110 via traces 124. As used herein, bridge bumps 118 refer to bumps on the dies 106, 108 through which electrical signals pass between different ones of the dies 106, 108. Thus, as shown in the illustrated example, the bridge bumps 118 of the first die 106 are electrically coupled to the bridge bumps 118 of the second die 108 via an interconnect bridge or interposer 126 embedded in the substrate 110. As represented in FIG. 1, core bumps 116 are typically larger than bridge bumps 118. In examples disclosed herein, the interconnects 114 include copper.

Typically, during construction of an IC package, copper bumps on a substrate are substantially aligned and mated with corresponding copper bumps or pads on a semiconductor die. The copper bumps of the substrate are typically soldered to the corresponding copper bumps or pads of the semiconductor die, where the bonded copper bumps and corresponding copper pads (and the associated solder material) form interconnects that electrically couple the substrate and the semiconductor die.

In some cases, due to errors and/or imprecision in manufacturing of solder joints, yield losses related to solder bridging may occur. Solder bridging occurs when two or more different interconnects of an IC package are inadvertently connected via solder material, thus forming an electrical short circuit. In some examples, such a short circuit may reduce functionality of and/or cause damage to one or more components of the IC package. Additionally, soldering may expose a substrate and/or a die of the IC package to relatively high temperatures (e.g., greater than 300 degrees Celsius). Some organic substrates may experience damage at such high temperatures, thereby making soldering unsuitable for certain applications.

Conversely, in the illustrated example of FIG. 1 and in accordance with teachings disclosed herein, soldering is not used to form the interconnects 114 between the dies 106, 108 and the substrate. That is, the interconnects 114 of the illustrated example do not include any tin or other solder material. Instead, in this example, surfaces of the bumps and/or pads that are bonded to form the interconnects 114 are nano-roughened using one or more surface treatments. For example, such surface treatments may include at least one of sequential bimetallic deposition and chemical etching, or sequential copper oxidation and reduction. In such examples, the nano-roughened surfaces enable direct copper-to-copper bonding between the bumps of the substrate 110 and corresponding pads of the dies 106, 108 under relatively low temperatures (e.g., less than 300 degrees Celsius). Such nano-roughening enables coupling of the dies 106, 108 to the substrate 110 without soldering. By eliminating the use of solder, examples disclosed herein enable the reduction in bump-to-bump pitch scaling of the interconnects 114 because there is no risk of solder inadvertently forming bridges between adjacent ones of the interconnects 114. In some examples, the elimination of solder through the direct bonding of nano-roughened copper surfaces enables a reduction in bump pitch from approximately 55 micrometers (μm) to approximately 25 μm or less. While soldering is not used in the illustrated example of FIG. 1, in some examples, a first portion of the interconnects 114 may be formed by soldering, and a second portion of the interconnects 114 different from the first portion may be formed by direct copper-to-copper bonding of nano-roughened surfaces.

Figure 2:
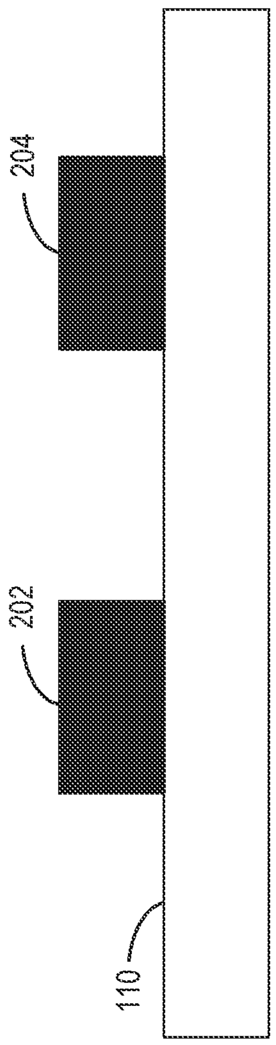
FIG. 2 illustrates a portion of the example substrate of the example IC package of FIG. 1.

FIG. 2 illustrates a portion of the example substrate 110 of the IC package 100 of FIG. 1. In the illustrated example of FIG. 2, first and second example bumps 202, 204 are coupled to the substrate 110, where the first and second bumps 202, 204 may form two of the interconnects 114 of FIG. 1. In some examples, the substrate 110 includes an organic material, and the first and second bumps 202, 204 include copper. While the first and second bumps 202, 204 are cylindrical in this example, a different shape (e.g., a spherical shape) of the first and second bumps 202, 204 can be used instead. In some examples, the first and second bumps 202, 204 are fabricated on the substrate 110. In the illustrated example of FIG. 2, the first and second bumps 202, 204 are shown prior to application of one or more surface treatments (e.g., sequential bimetallic deposition and chemical etching, sequential copper oxidation and reduction, etc.) used for creating nano-roughened surfaces.

Figure 3:
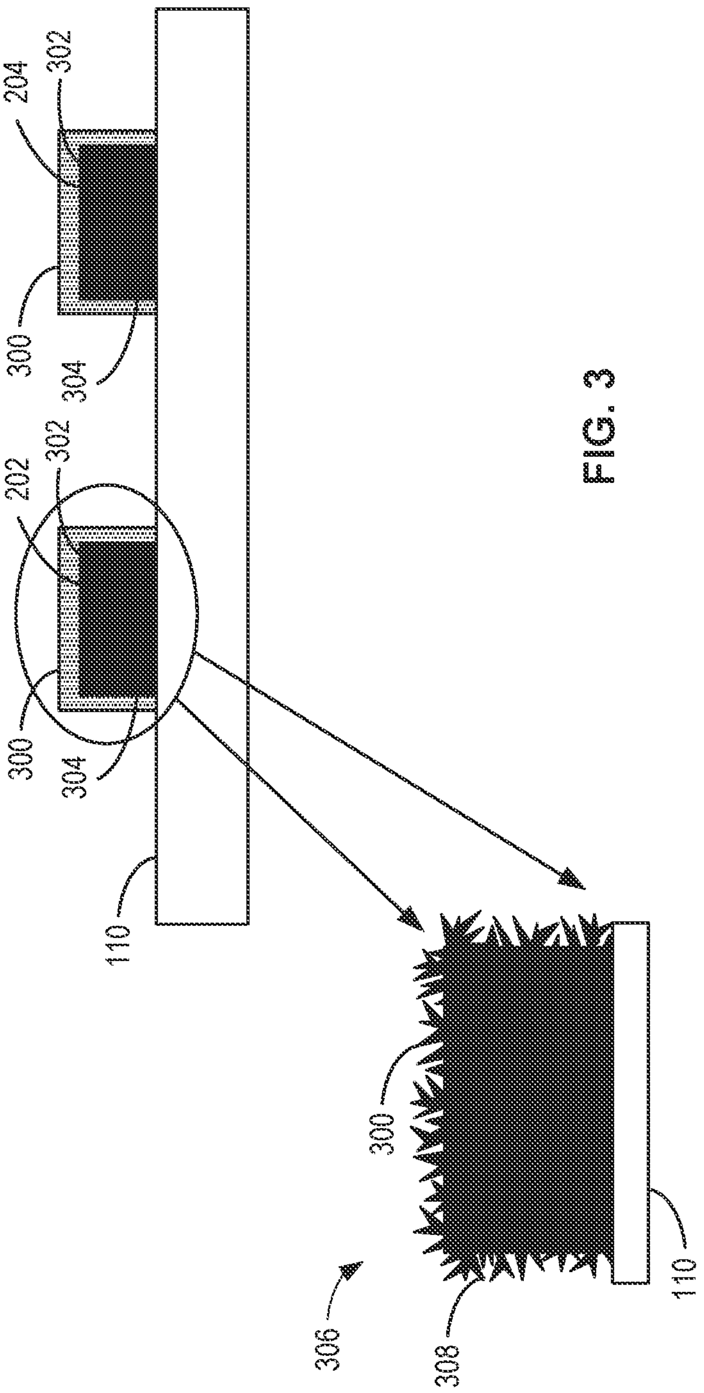
FIG. 3 illustrates the example substrate of FIG. 2 after nano-roughening of example first and second bumps of the example substrate of FIG. 1.

FIG. 3 illustrates the example substrate 110 after nano-roughening of the example first and second bumps 202, 204 of FIG. 2. In the illustrated example of FIG. 3, the first and second bumps 202, 204 include example nano-roughened surfaces 300. In some examples, the nano-roughened surfaces 300 are on example top surfaces (e.g., bonding surfaces) 302 and example sidewall surfaces 304 of the first and second bumps 202, 204. Stated differently, the nano-roughened surfaces 300 extend circumferentially around the first and second bumps 202, 204. Stated differently, the nano-roughened surfaces 300 extend a full way around outer perimeters of the first and second bumps 202, 204. In an example enlarged view 306 of the first bump 202, example surface features 308 of the nano-roughened surface 300 are exaggerated (relative to the size of the first bump 202) for emphasis. In the enlarged view 306, the nano-roughened surface 300 includes high-frequency, low-amplitude surface features (e.g., peaks and valleys). In particular, the nano-roughened surface 300 has a roughness skewness greater than zero (e.g., $Rsk>0$) and a roughness kurtosis less than three (e.g., $Rku<3$). By contrast, some typical copper roughness morphologies (e.g., prior to nano-roughening) include a roughness skewness less than zero (e.g., $Rsk<0$) and a roughness kurtosis greater than three (e.g., $Rku>3$). In this example, the nano-roughened surface 300 has a root mean square roughness less than or equal to 100 nm.

Figure 4:
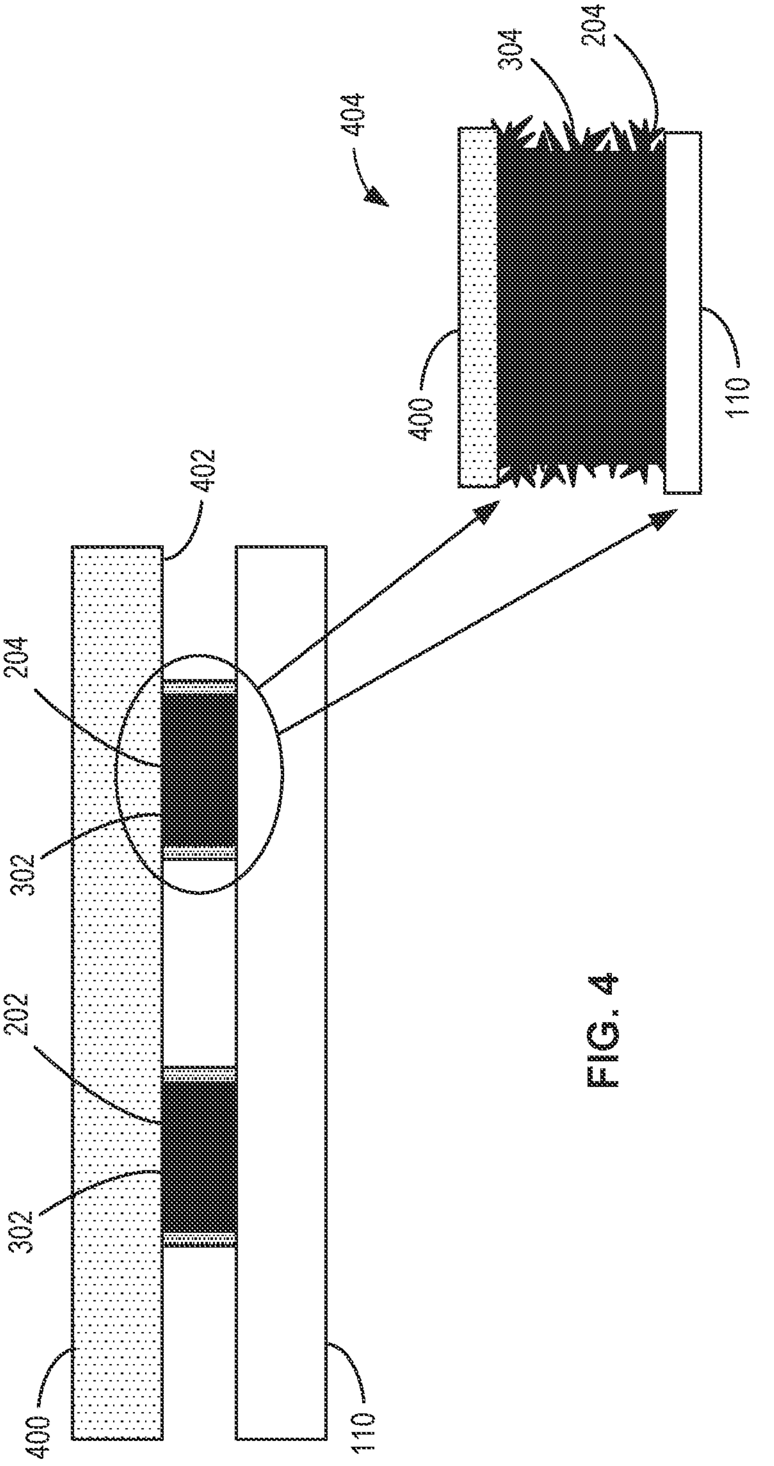
FIG. 4 illustrates an example die coupled to the first and second bumps of the example substrate of FIG. 3.

FIG. 4 illustrates an example die (e.g., a semiconductor die) 400 coupled to the first and second bumps 202, 204 of the substrate 110. In the illustrated example of FIG. 4, the die 400 corresponds to one of the dies 106, 108 of the IC package 100 of FIG. 1. In this example, the top surfaces 302 of the first and second bumps 202, 204 are coupled to an example bottom surface 402 of the die 400, where the bottom surface 402 includes copper. In this example, the bottom surface 402 is not nano-roughened and, as such, is a substantially flat surface. Stated differently, surface treatments have not been applied to the bottom surface 402 prior to coupling of the die 400 to the first and second bumps 202, 204. In other examples, one or more portions of the bottom surface 402 are nano-roughened, and the first and second bumps 202, 204 are aligned with the nano-roughened portions of the bottom surface 402.

In the illustrated example of FIG. 4, the first and second bumps 202, 204 are fixedly coupled to the bottom surface 402 of the die 400 via copper-to-copper bonding. In such examples, the high-frequency, low-amplitude surface features of the first and second bumps 202, 204 interlocks with corresponding surface features of the bottom surface 402. In some examples, heat and/or pressure are applied during coupling of the first and second bumps 202, 204 with the bottom surface 402 to cause copper-to-copper bonding therebetween. In some examples, a temperature of the heat applied is relatively low (e.g., less than 300 degrees Celsius), so that the substrate 110 and/or the die 400 is/are not damaged during the coupling. In some examples, the coupling is performed using a thermal compression bonding (TCB) machine. Furthermore, in examples disclosed herein, the coupling is performed without the use of solder material between the first and second bumps 202, 204 and the die 400, thereby reducing undesired defects such as solder bridging.

In the illustrated example of FIG. 4, an example enlarged view 404 of the second bump 204 is shown. In this example, after the copper-to-copper bonding, the second bump 204 and the bottom surface 402 are merged, such that an interface between the second bump 204 and the bottom surface 402 (or at least the surface features along the interface) is substantially or completely undetectable. Stated differently, the bonding of the second bump 204 to mating copper on the facing surface 402 of the die 400 forms a copper interconnect in which the copper extends continuously through a full distance between the bottom surface 402 of the die 400 and the facing surface of the substrate 110. While the surface features along the interfacial surface (e.g., the top surface 302 of FIG. 3) of the second bump 204 are no longer detectable once the interfacial surface is bonded to the die 400, the sidewall surface 304 of the second bump 204 retains the high-frequency, low-amplitude surface topology characteristic of the nano-roughened surface 300 of FIG. 3. Accordingly, surface features of the sidewall surface 304 can be examined after production of the IC package 100 of FIG.

1 to detect whether nano-roughening of the first and second bumps 202, 204 has occurred.

Figure 5:
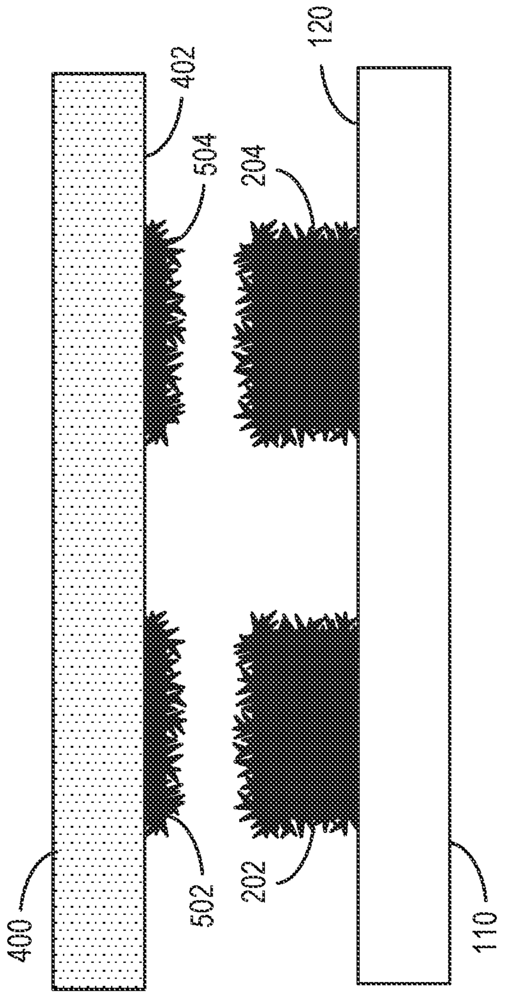
FIG. 5 illustrates the example substrate and the example die of FIG. 4 prior to coupling, where the die includes example first and second pads.

FIG. 5 illustrates the example substrate 110 and the example die 400 prior to coupling, where the die 400 includes example first and second pads (e.g., die pads) 502, 504 in this example. In the illustrated example of FIG. 5, the first and second pads 502, 504 are coupled to the bottom surface 402 of the die 400. In this example, each of the first and second bumps 202, 204 and the first and second pads 502, 504 is nano-roughened prior to assembly of the IC package 100 of FIG. 1. As shown in the illustrated example of FIG. 5, during coupling of the die 400 to the substrate 110, the die 400 is positioned such that the first bump 202 and the first pad 502 are substantially aligned, and the second bump 204 and the second pad 504 are substantially aligned. While the die 400 includes the first and second pads 502, 504 in this example, in other examples, the die 400 can include one or more bumps similar to the first and second bumps 202, 204. In such examples, the one or more bumps of the die 400 can be coupled to the first and second bumps 202, 204 of the substrate 110 via direct copper-to-copper bonding. In other examples, the die 400 includes one or more bumps similar to the first and second bumps 202, 204, whereas the substrate 110 includes one or more pads similar to the first and second pads 502, 504. In other words, the die 400 can include either bumps and/or pads that have been nano-roughened to bond with corresponding nano-roughened bumps and/or pads on the substrate 110.

Figure 6:
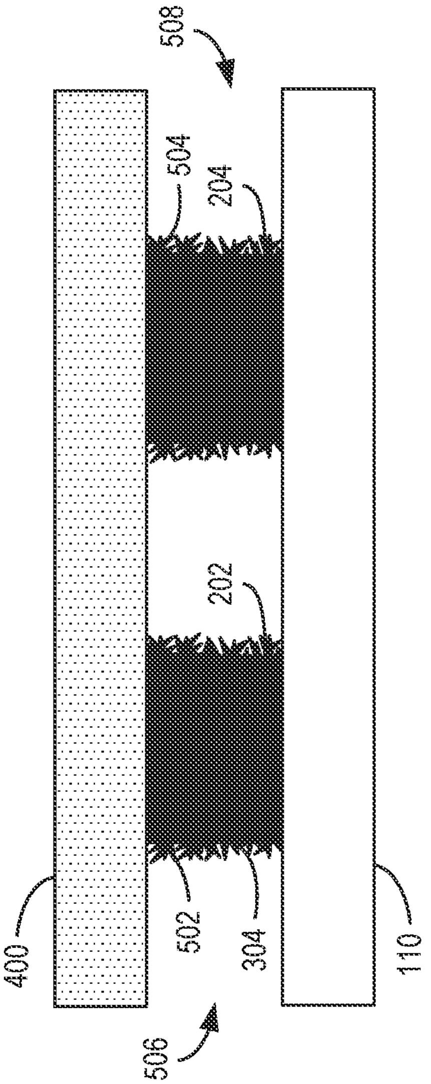
FIG. 6 illustrates the example substrate and the example die of FIG. 5 after coupling.

FIG. 6 illustrates the example substrate 110 and the example die 400 of FIG. 5 after coupling. In the illustrated example of FIG. 6, the first bump 202 and the first pad 502 are coupled via copper-to-copper bonding to form a first example interconnect (e.g., a metal interconnect) 506, and the second bump 204 and the second pad 504 are coupled via copper-to-copper bonding to form a second example interconnect 508. In some examples, the low-amplitude topology produced by nano-roughening of the first and second bumps 202, 204 and/or the first and second pads 502, 504 reduces a size and/or number of voids in the first and second interconnects 506, 508 when compared to the size and/or number of voids produced using other coupling techniques such as, for example, soldering. In some examples, the reduction of size and/or number of voids in the first and second interconnects 506, 508 improves a reliability and/or strength thereof.

In some examples, the sidewall surfaces 304 can be used for detecting, prior to and/or after coupling of the die 400 to the substrate 110, whether nano-roughening of the first and second bumps 202, 204 has occurred. For example, the roughness skewness and/or the roughness kurtosis of the sidewall surfaces 304 can be measured, and an operator can determine that the first and second bumps 202, 204 are nano-roughened in response to determining that the measured roughness skewness satisfies a skewness threshold (e.g., $Rsk>0$) and the measured roughness kurtosis satisfies a kurtosis threshold (e.g., $Rku<3$).

Figure 7:
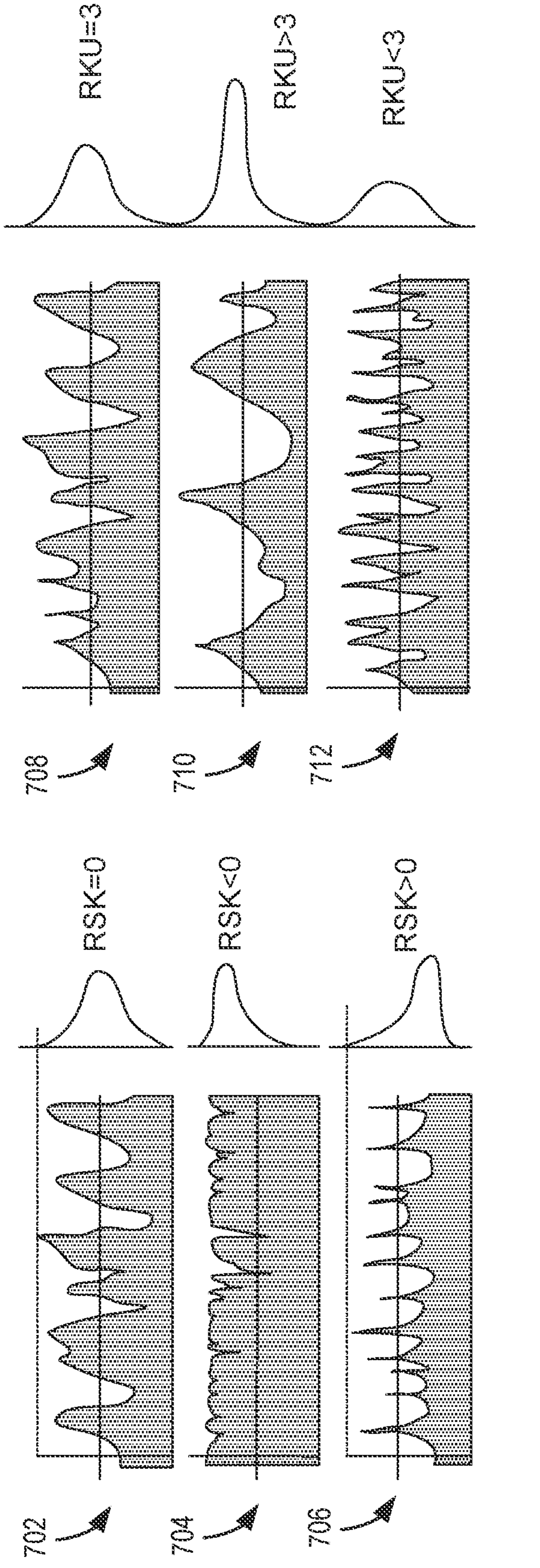
FIG. 7 illustrates example graphs representing example copper surface morphologies.

FIG. 7 illustrates example graphs 702, 704, 706, 708, 710, 712 representing example copper surface morphologies. In the illustrated example of FIG. 7, the first, second, and third graphs 702, 704, 706 represent copper surface morphologies having a roughness skewness of $Rsk=0$, $Rsk<0$, and $Rsk>0$, respectively. Furthermore, the fourth, fifth, and sixth graphs 708, 710, 712 represent copper surface morphologies having a roughness kurtosis of $Rku\approx 3$, $Rku>3$, and $Rku<3$, respectively. In some examples, the second and fifth graphs 704, 710 correspond to copper surfaces that are couplable to one or more components of the IC package 100 of FIG. 1 using traditional coupling techniques (e.g., soldering). In such examples, as shown in the second graph 704, the copper surface has a relatively flat surface topology with cavities (e.g., valleys) extending therein that occur at a relatively low frequency. In some examples, the third and fourth graphs 706, 710 correspond to copper surfaces that have been nano-roughened. In such examples, as shown in the third graph 706, the nano-roughened copper surface includes a high-frequency, low-amplitude topology with peaks extending therefrom. In some examples, the peaks of the nano-roughened copper surface interlock with corresponding peaks of a different nano-roughened copper surface, such that copper-to-copper bonding can occur therebetween with reduced size and/or number of voids (e.g., gaps).

Figure 8:
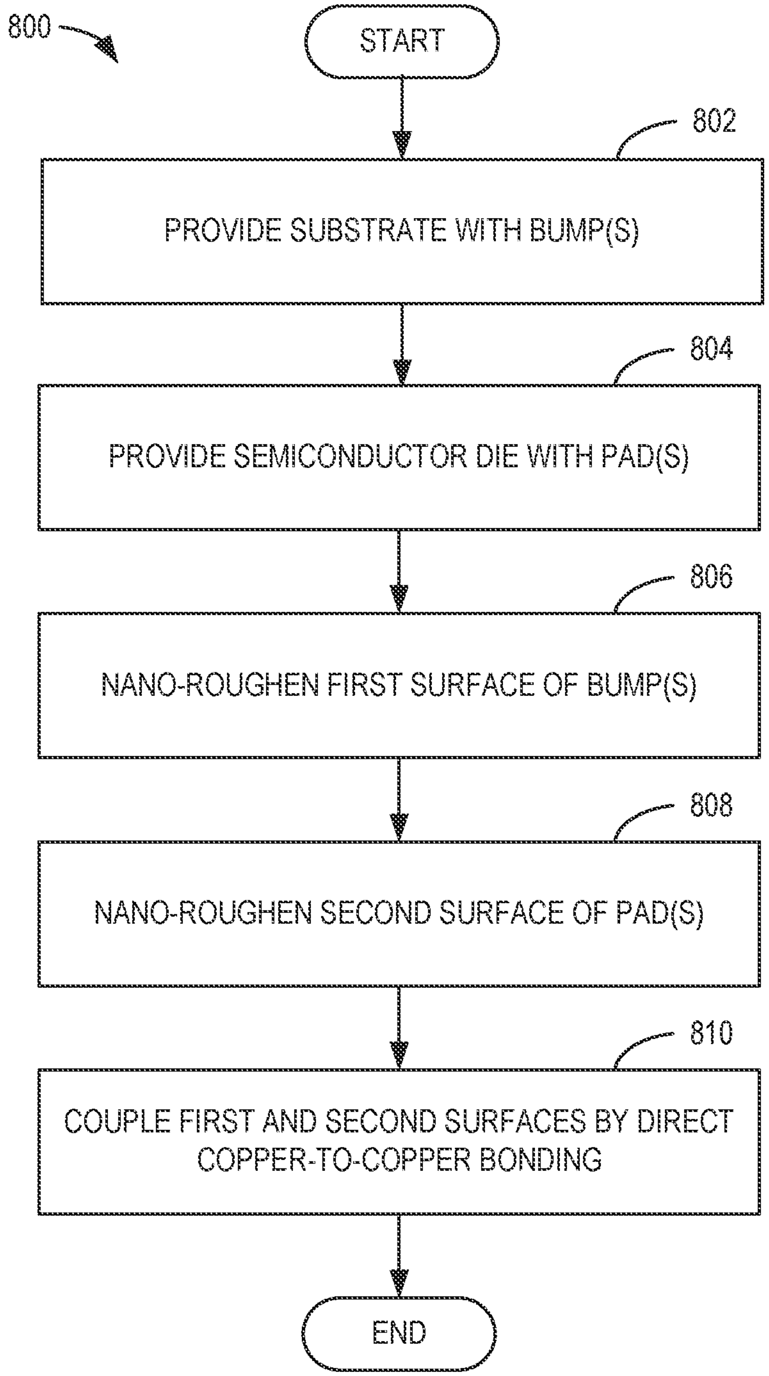
FIG. 8 is a flowchart representative of example method of manufacturing the example IC package of FIG. 1.

FIG. 8 is a flowchart representative of example method 800 of manufacturing the example IC package 100 of FIG. 1 and, more particularly, an example method of coupling the example substrate 110 and the example die 400 of FIG. 4 and/or FIGS. 5 and 6. In some examples, some or all of the operations outlined in the example method 800 are performed automatically by fabrication equipment that is programmed to perform the operations. Although the example method of manufacturing is described with reference to the flowchart illustrated in FIG. 8, many other methods may alternatively be used. For example, the order of execution of the blocks may be changed, and/or some of the blocks described may be combined, divided, re-arranged, omitted, eliminated, and/or implemented in any other way.

The example method 800 of FIG. 8 begins at block 802 by providing the substrate 110 with the example first and second bumps 202, 204 of FIG. 2. For example, the first and second bumps 202, 204 are fabricated on the example inner surface 120 of the substrate 110.

At block 804, the example method 800 includes providing the semiconductor die 400 with the example first and second pads 502, 504. For example, the first and second pads 502, 504 are fabricated on the example bottom surface 402 of the die 400.

At block 806, the example method 800 includes nano-roughening first surfaces of the first and second bumps 202, 204. For example, the first and second bumps 202, 204 are nano-roughened via one or more surface treatments (e.g., sequential bimetallic deposition and chemical etching and/or sequential copper oxidation and reduction) to produce the example nano-roughened surface 300 on example top surfaces 302 and example sidewall surfaces 304 of the first and second bumps 202, 204. In some examples, all exposed surfaces of the first and second bumps 202, 204 are nano-roughened.

At block 808, the example method 800 includes nano-roughening second surfaces of the first and second pads 502, 504. For example, the first and second pads 502, 504 are nano-roughened via the one or more surface treatments to produce the nano-roughened surface 300 on the first and second pads 502, 504. In some examples, all exposed surfaces of the first and second pads 502, 504 are nano-roughened.

At block 810, the example method 800 includes the first surfaces of the first and second bumps 202, 204 and the second surfaces of the first and second pads 502, 504 are coupled by direct copper-to-copper bonding. More particularly, the interfacing surfaces on the bumps 202, 204 and the corresponding pads 502, 504 are coupled. For example, the first and second bumps 202, 204 are aligned with the corresponding first and second pads 502, 504, and heat and/or pressure is applied to the substrate 110 and/or the die 400 to cause the direct copper-to-copper bonding between the first and second surfaces.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that produce integrated circuit (IC) packages with nano-roughened interconnects. Examples disclosed herein produce nano-roughened surfaces on bumps and/or pads of a substrate and/or on corresponding bumps and/or pads of a semiconductor die to be attached to the substrate. The nano-roughened surfaces of the bumps and/or pads enable direct copper-to-copper coupling of the bumps and/or pads without the use of solder. Advantageously, the disclosed systems, methods, apparatus, and articles of manufacture improve the efficiency of using a computing device by enabling the reduction in the pitch and/or spacing of interconnects between the corresponding bumps and pads of the IC package, thus increasing a number of the interconnects that can be implemented in a given IC package and, as a result, improving connectivity and speed of communication therein. The reduction in the pitch and size of bumps and/or pads is possible because solder is no longer needed to bond the bumps and/or pads, thereby avoiding defects that may be caused by solder bridging. The disclosed systems, methods, apparatus, and articles of manufacture are accordingly directed to one or more improvement(s) in the operation of a machine such as a computer or other electronic and/or mechanical device.

Example methods, apparatus, systems, and articles of manufacture to produce integrated circuit packages with nano-roughened interconnects are disclosed herein. Further examples and combinations thereof include the following:

Example 1 includes an integrated circuit (IC) package comprising a substrate, a semiconductor die, and a metal interconnect to electrically couple the semiconductor die to the substrate, the metal interconnect including a nano-roughened surface.

Example 2 includes the IC package of example 1, wherein the metal interconnect includes copper.

Example 3 includes the IC package of example 2, wherein the copper extends continuously across a distance between facing surfaces of the semiconductor die and the substrate.

Example 4 includes the IC package of example 1, wherein the metal interconnect is to electrically couple the semiconductor die to the substrate without solder.

Example 5 includes the IC package of example 1, wherein the substrate is a package substrate of the IC package.

Example 6 includes the IC package of example 1, wherein the semiconductor die is a first semiconductor die, the substrate corresponding to a second semiconductor die.

Example 7 includes the IC package of example 1, wherein a skewness of the nano-roughened surface is greater than 0.

Example 8 includes the IC package of example 1, wherein a kurtosis of the nano-roughened surface is less than 3.

Example 9 includes the IC package of example 1, wherein the metal interconnect is cylindrical, the nano-roughened surface to extend circumferentially around the metal interconnect.

Example 10 includes the IC package of example 1, wherein the metal interconnect corresponds to a first copper bump and a second copper bump bonded together without solder, the first copper bump on the semiconductor die, the second copper bump on the substrate.

Example 11 includes the IC package of example 10, wherein at least one of the first copper bump or the second copper bump includes the nano-roughened surface.

Example 12 includes the IC package of example 1, wherein the substrate includes a copper die pad and the semiconductor die includes a copper bump, the metal interconnect corresponding to a direct copper-to-copper bonding of the copper die pad and the copper bump.

Example 13 includes the IC package of example 12, wherein at least one of the copper bump or the copper die pad includes the nano-roughened surface.

Example 14 includes the IC package of example 1, wherein the metal interconnect is a first metal interconnect, the IC package further including an array of metal interconnects, the array of metal interconnects including the first metal interconnect, the array of metal interconnects spaced at a pitch that is 25 μm or less.

Example 15 includes a method to manufacture an integrated circuit (IC) package, the method comprising nano-roughening at least one of a first surface of a substrate or a second surface of a semiconductor die, and coupling the first surface to the second surface to electrically connect the semiconductor die to the substrate.

Example 16 includes the method of example 15, further including applying heat during the coupling of the first and second surfaces, a temperature of the heat being less than 300 degrees Celsius.

Example 17 includes the method of example 15, wherein the coupling of the first and second surfaces is accomplished by direct copper-to-copper bonding of the first and second surfaces.

Example 18 includes the method of example 15, wherein the coupling of the first and second surfaces is accomplished without using solder.

Example 19 includes the method of example 13, wherein the nano-roughening of the at least one of the first surface or the second surface includes causing the at least one of the first surface or the second surface to have a skewness greater than 0 and a kurtosis less than 3.

Example 20 includes an integrated circuit (IC) package comprising a package substrate including a first bump or a first pad, and a semiconductor die including a second bump or a second pad, the first bump or the first pad fixedly coupled to the second bump or the second pad by a direct copper-to-copper bond.

Example 21 includes the IC package of example 20, wherein at least one of (i) the first bump or the first pad or (ii) the second bump or the second pad includes a nano-roughened surface.

Example 22 includes the IC package of example 20, wherein the at least one of (i) the first bump or the first pad or (ii) the second bump or the second pad includes a skewness greater than 0.

Example 23 includes the IC package of example 20, wherein the at least one of (i) the first bump or the first pad or (ii) the second bump or the second pad includes a kurtosis less than 3.

Example 24 includes the IC package of example 19, wherein the nano-roughened surface extends a full way around an outer perimeter of the at least one of (i) the first bump or the first pad or (i) the second bump or the second pad.

Example 25 includes the IC package of example 19, wherein the first bump or the first pad is fixedly coupled to the second bump or the second pad without solder.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. An integrated circuit (IC) package comprising:

a substrate;

a semiconductor die; and a metal interconnect to electrically couple the semiconductor die to the substrate without solder, the metal interconnect including a nano-roughened surface along a lateral side of the metal interconnect, the nano-roughened surface spaced apart from a first end of the metal interconnect, the first end proximate the semiconductor die, the nano-roughened surface spaced apart from a second end of the metal interconnect, the second end proximate the substrate.

2. The IC package of claim 1, wherein the metal interconnect includes copper.

3. The IC package of claim 2, wherein the copper extends continuously across a distance between facing surfaces of the semiconductor die and the substrate.

4. The IC package of claim 1, wherein the substrate is a package substrate of the IC package.

5. The IC package of claim 1, wherein the semiconductor die is a first semiconductor die, the substrate corresponding to a second semiconductor die.

6. The IC package of claim 1, wherein a skewness of the nano-roughened surface is greater than 0.

7. The IC package of claim 1, wherein a kurtosis of the nano-roughened surface is less than 3.

8. The IC package of claim 1, wherein the metal interconnect includes metal that extends continuously from the substrate to the semiconductor die.

9. The IC package of claim 1, wherein the metal interconnect includes:

a first end proximate the substrate;

a second end proximate the semiconductor die; and a lateral sidewall extending between the first and second ends, the nano-roughened surface along the lateral sidewall and spaced apart from the first and second ends.

10. An integrated circuit (IC) package comprising:

a substrate;

a semiconductor die; and a metal interconnect to electrically couple the semiconductor die to the substrate, the metal interconnect including a nano-roughened surface, the metal interconnect being cylindrical with a central axis extending from a first end proximate the substrate to a second end proximate the semiconductor die, the nano-roughened surface to extend circumferentially around the metal interconnect.

11. An integrated circuit (IC) package comprising:

a substrate;

a semiconductor die; and a metal interconnect to electrically couple the semiconductor die to the substrate, the metal interconnect including a nano-roughened surface, the metal interconnect corresponding to a first copper bump and a second copper bump bonded together without solder, the first copper bump on the semiconductor die, the second copper bump on the substrate.

12. The IC package of claim 11, wherein at least one of the first copper bump or the second copper bump includes the nano-roughened surface.

13. An integrated circuit (IC) package comprising:

a substrate including a copper die pad;

a semiconductor die including a copper bump; and a metal interconnect to electrically couple the semiconductor die to the substrate, the metal interconnect including a nano-roughened surface, the metal interconnect corresponding to a direct copper-to-copper bonding of the copper die pad and the copper bump.

14. The IC package of claim 13, wherein at least one of the copper bump or the copper die pad includes the nano-roughened surface.

15. An integrated circuit (IC) package comprising:

a substrate;

a semiconductor die; and an array of metal interconnects, the array of metal interconnects including a first metal interconnect, the first metal interconnect to electrically couple the semiconductor die to the substrate, the first metal interconnect including a nano-roughened surface, the array of metal interconnects spaced at a pitch that is 25 μm or less.

16. An integrated circuit (IC) package comprising:

a package substrate including a first bump or a first pad; and a semiconductor die including a second bump or a second pad, the first bump or the first pad fixedly coupled to the second bump or the second pad by a direct copper-to-copper bond, at least one of (i) the first bump or the first pad or (ii) the second bump or the second pad including a nano-roughened surface.

17. The IC package of claim 16, wherein the at least one of (i) the first bump or the first pad or (ii) the second bump or the second pad includes a skewness greater than 0.

18. The IC package of claim 16, wherein the at least one of (i) the first bump or the first pad or (ii) the second bump or the second pad includes a kurtosis less than 3.

19. The IC package of claim 16, wherein the nano-roughened surface extends a full way around an outer perimeter of the at least one of (i) the first bump or the first pad or (ii) the second bump or the second pad.

20. The IC package of claim 16, wherein the first bump or the first pad is fixedly coupled to the second bump or the second pad without solder.

* * * * *